US012557550B2

(12) United States Patent
Griffiths et al.

(10) Patent No.: US 12,557,550 B2
(45) Date of Patent: Feb. 17, 2026

(54) THERMOELECTRIC DEVICE (71) Applicant: KOHLER MIRA LIMITED, Cheltenham (GB)

(72) Inventors: Daniel Griffiths, Cheltenham (GB); Benjamin Lea, Cheltenham (GB); Mitchell Connor Hobbs, Gloucester (GB)

(73) Assignee: Kohler Mira Limited, Cheltenham (GB)

( * ) Notice: Subject to any disclaimer, the term of this patent is extended or adjusted under 35 U.S.C. 154(b) by 241 days.

(21) Appl. No.: 17/848,282

(22) Filed: Jun. 23, 2022

(65) Prior Publication Data

US 2022/0320407 A1 Oct. 6, 2022

Related U.S. Application Data

(63) Continuation of application No. PCT/GB2021/050041, filed on Jan. 8, 2021.

(30) Foreign Application Priority Data

Jan. 9, 2020 (GB) ..................................... 2000284

(51) Int. Cl.
*H10N 10/13* (2023.01)
*H10N 10/17* (2023.01)
(52) U.S. Cl.
CPC ............. *H10N 10/13* (2023.02); *H10N 10/17* (2023.02)

(58) Field of Classification Search
CPC ............................... H10N 10/13; H10N 10/17
See application file for complete search history.

(56) References Cited

U.S. PATENT DOCUMENTS

| 2003/0101510 | A1 | 6/2003 | Ottelli |
| 2003/0218074 | A1* | 11/2003 | Beck .................. G05D 23/1353 236/12.1 |
| 2005/0172992 | A1 | 8/2005 | Shimoji et al. |
| 2014/0238005 | A1* | 8/2014 | Bewlay .................. F01N 5/025 136/201 |

FOREIGN PATENT DOCUMENTS

| CN | 109199179 A | 1/2019 |
| EP | 1376291 A2 | 1/2004 |

(Continued)

OTHER PUBLICATIONS

India Office Action dated Nov. 28, 2022, issued in corresponding India Application.

(Continued)

*Primary Examiner* — Lindsey A Buck
(74) *Attorney, Agent, or Firm* — Husch Blackwell LLP (57) ABSTRACT

An apparatus is provided for generating an electrical current from a temperature differential in an ablutionary fitting. A heat transfer plate includes a projection directly contacting water carried in a first region of the fitting. A thermoelectric module includes one or more thermoelectric elements thermally coupled between the heat transfer plate and a housing of the ablutionary fitting in a second region of the ablutionary fitting. The thermoelectric elements generate electricity from a temperature differential between water carried in the first and second regions of the ablutionary fitting.

19 Claims, 7 Drawing Sheets

(56) References Cited

FOREIGN PATENT DOCUMENTS

| | | |
|---|---|---|
| GB | 2246188 A | 1/1992 |
| GB | 2341792 A | 3/2000 |
| GB | 2386573 A | 9/2003 |
| GB | 2574855 A | 12/2019 |
| JP | 2003102638 A | 4/2003 |
| KR | 1020190082479 A | 7/2019 |
| WO | 2011152784 A1 | 12/2011 |

OTHER PUBLICATIONS

Patents Act 1977: Search Report under Section 17 for Application No. GB2000284.6, Jul. 5, 2020, 2 pages.
International Search Report for International Application No. PCT/GB2021/050041, Sep. 9, 2021, 6 pages.

* cited by examiner

Fig. 5

THERMOELECTRIC DEVICE

CROSS REFERENCE

This application is a continuation of and claims priority to PCT Application No. PCT/GB2021/050041, filed Jan. 8, 2021, which itself claims priority to Great Britain Patent Application No. 2000284.6, filed Jan. 9, 2020, the entireties of both of which are hereby incorporated by reference.

FIELD OF THE INVENTION

The present disclosure relates to an apparatus for generating an electrical current from a temperature differential in an ablutionary fitting, and to an ablutionary fitting comprising the apparatus.

BRIEF DESCRIPTION OF THE DRAWINGS

Embodiments of the invention will now be described, by way of example only, with reference to the drawings, in which.

DETAILED DESCRIPTION OF THE DRAWINGS

According to a first aspect of the invention, there is provided an apparatus for generating an electrical current from a temperature differential in an ablutionary fitting, the apparatus comprising: a heat transfer plate having a projection configured to directly contact water carried in a first region of the fitting; and a thermoelectric module comprising one or more thermoelectric elements, the thermoelectric elements configured to be thermally coupled between the heat transfer plate and a housing of the ablutionary fitting in a second region of the ablutionary fitting, the thermoelectric elements also being configured to generate electricity from a temperature differential between water carried the first and second regions of the ablutionary fitting.

The apparatus allows a thermoelectric module to be integrated into an ablutionary fitting with a mixer cartridge in a space and cost effective manner, at low cost and without significant redesign. The ablutionary fitting may be a thermostatic ablutionary fitting.

The plate allows the location and orientation of the temperature differential to be moved for easy integration of the thermoelectric module into the housing of an ablutionary fitting. Heat transfer from the first region to the thermoelectric module is carried out by direct contact with the heat transfer plate. However, since the heat transfer occurs at the inlet of the thermoelectric cartridge, no water is diverted away from the cartridge during operation of the apparatus. Accordingly, use of the apparatus may have minimal effect on the operation of the ablutionary or plumbing system. The thermoelectric module is located at the second region, and so it is not necessary to move this heat. The apparatus recovers energy (heat) that would otherwise go to waste and generates useful electricity.

The projection may be configured to extend through an aperture formed in the housing of the ablutionary fitting, into an inner chamber of the ablutionary fitting.

The water carried in the first region may be at a first temperature, and the water carried in the second region may be at a second temperature, different to the first.

The heat transfer plate may comprise a first portion including the projection, and a second portion extending away from the first portion. The second portion may be configured to be thermally coupled to the thermoelectric elements. The first portion may also be thermally coupled to the second portion.

The projection may extend along a first direction. The second portion may extend in a direction substantially perpendicular to the first direction.

The second portion may be substantially planar. The projection may extend out of the plane of the heat transfer plate.

The projection may comprise a plurality of surfaces arranged to extend into a chamber formed in the first region of the ablutionary fitting.

The apparatus may comprise a seal to form a water-tight seal between the first portion of the heat transfer plate and the housing of the ablutionary fitting, around the projection.

The heat transfer plate may at least in part form a seat for locating the seal.

The thermoelectric module may be configured to be in direct contact with the housing of the ablutionary fitting.

The apparatus may comprise an electrical socket electrically coupled to the thermoelectric elements and configured to be connected to an output load.

The socket may be mounted on a support member, and may be electrically coupled to the thermoelectric elements by wires.

The output load may comprise one or more light emitting devices.

The apparatus may comprise: a controller configured to control the output from the socket and/or the operation of the output load, in dependence on a voltage generated by the thermoelectric module.

The controller may be configured to control electrical output from the socket and/or the output load, in dependence on the stability of the voltage generated by the thermoelectric module.

The controller may be configured to control the output from the socket and/or the operation of the output load in two modes comprising: a first mode when the output is stable, and a second mode when the output is unstable.

The output in the first mode may be dependent on the magnitude of the voltage.

The heat transfer plate may have a first side and a second side. The projection may extend from the first side of the heat transfer plate. The first side of the heat transfer plate may also abut the thermoelectric module.

The apparatus may be configured to be installed in an ablutionary fitting including a mixer cartridge.

According to a second aspect of the invention, there is provided an ablutionary fitting comprising: a housing defining: a first inlet for receiving water at a first temperature, a second inlet for receiving water at a second temperature, different to the first, and an internal chamber for receiving a cartridge for mixing the water for the first and second inlet; and an apparatus according to the first aspect, mounted on an exterior surface of the housing.

The housing may comprise an aperture extending through the housing into an internal chamber in the first region of the ablutionary fitting.

The housing may at least in part define a seat for locating the seal.

The ablutionary fitting may comprise an indent in the housing arranged to receive the thermoelectric module, the indent forming the second region.

The inner chamber and housing may be substantially cylindrical, extending in an axial direction.

The ablutionary fitting may comprise a wedge shaped projection to form a planar surface for mounting the thermoelectric module and heat transfer plate.

The housing may define a sub-chamber formed within the inner chamber at a first axial position along a length of the cylinder, where water received at the first inlet enters the inner chamber to enter the cartridge, the sub-chamber forming the first region.

The sub-chamber may extend around at least a portion of the circumference of the cylinder.

At least a portion of the sub-chamber may overlap the second region in a circumferential direction. The first region and second region may be spaced along the axial direction.

The housing may define an inlet passage for directing water from the second inlet to a second sub-chamber formed within the inner chamber, where water from the second inlet enters the cartridge. The housing may further define an outlet passage for directing water from the cartridge to an outlet device. The inlet passage and outlet passage may extend along the axial direction and may be circumferentially spaced from each other. The second region may be circumferentially between the inlet passage and the outlet passage.

The ablutionary fitting may comprise a second apparatus according to the first aspect. The first and second apparatus may be circumferentially spaced around the housing, on opposite sides of the inlet passage.

The first sub-chamber may circumferentially overlap the first and second apparatus, such that the projection of the heat transfer plate of the first apparatus and the projection of the heat transfer plate of the second apparatus both project into the same sub-chamber.

The ablutionary fitting may include a mixer cartridge. The mixer cartridge may be a thermostatic cartridge.

It will be appreciated that features of the ablutionary fitting discussed in relation to the first apparatus may also apply to the second apparatus.

It will also be appreciated that features discussed in relation to any particular aspect may also be applied to any other aspect of the invention.

Figure 1:
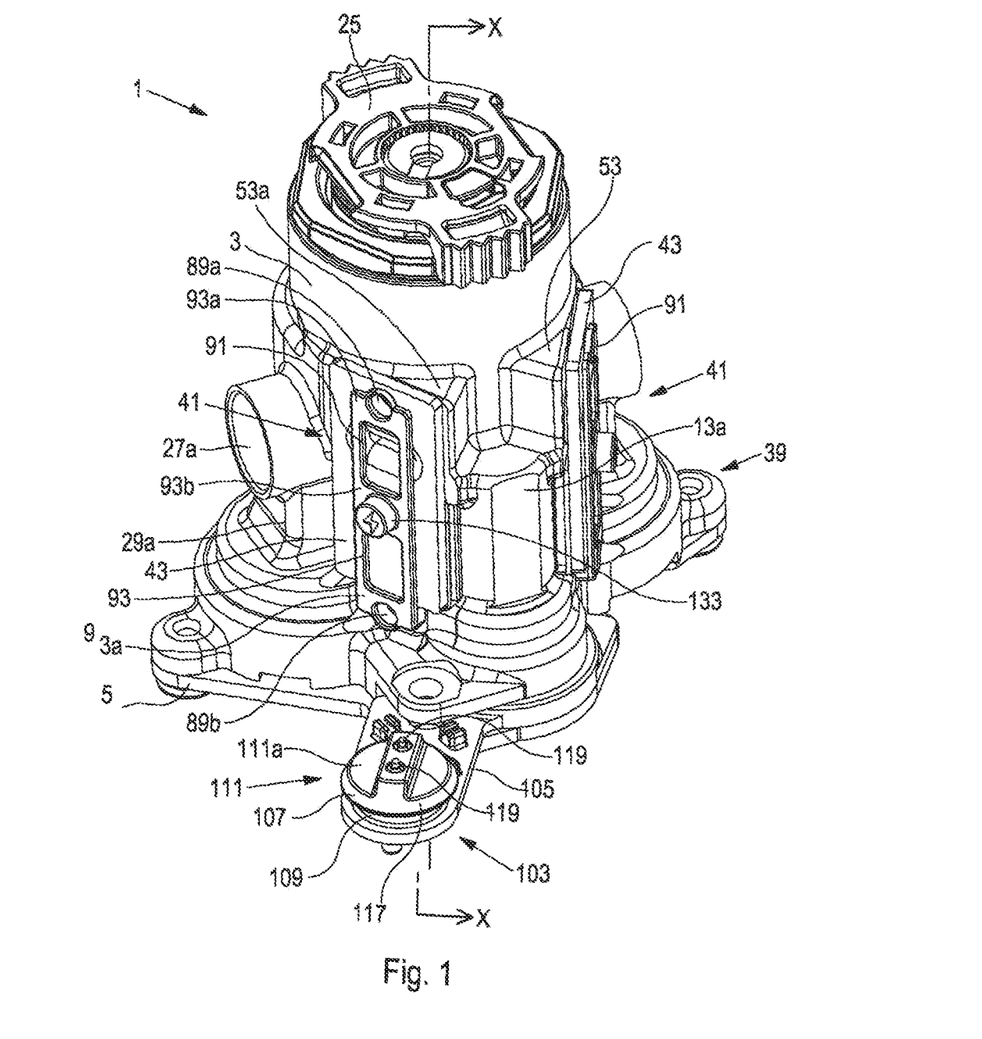
FIG. 1 illustrates an example housing of an ablutionary fitting.
Figure 2A:
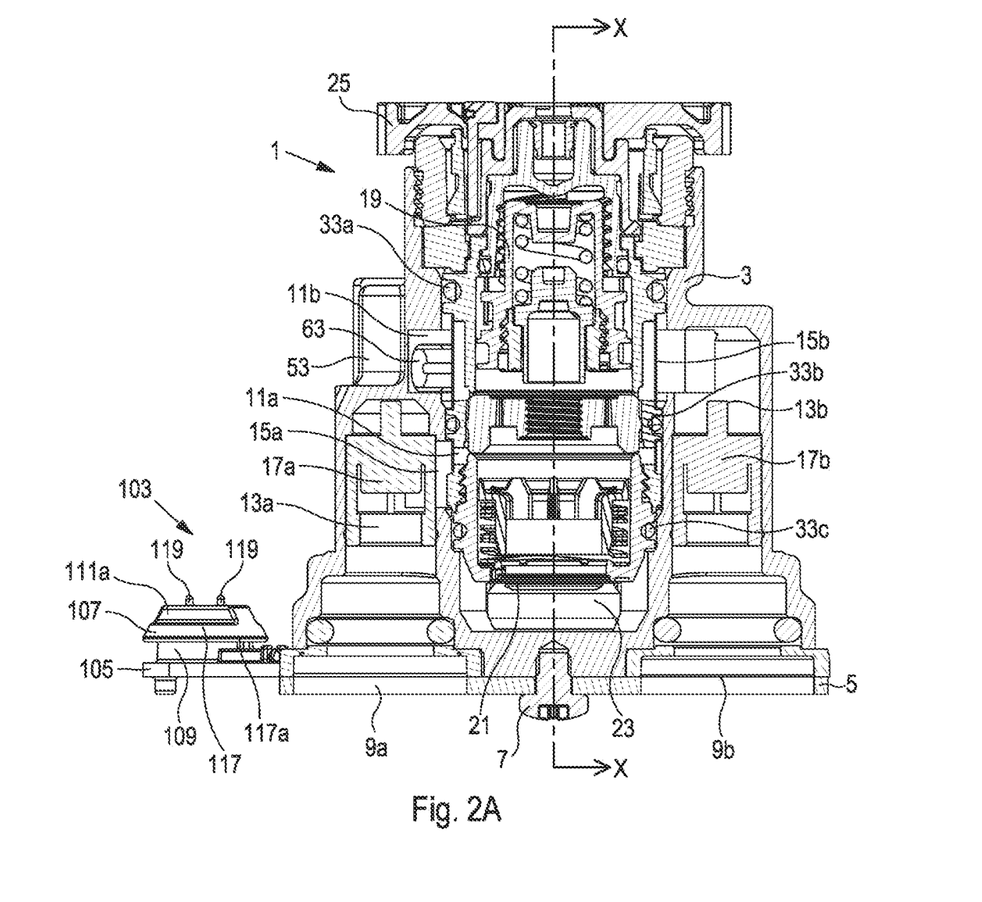
FIG. 2A illustrates a sectional view of an example fitting taken through the inlets of the body.
Figure 2B:
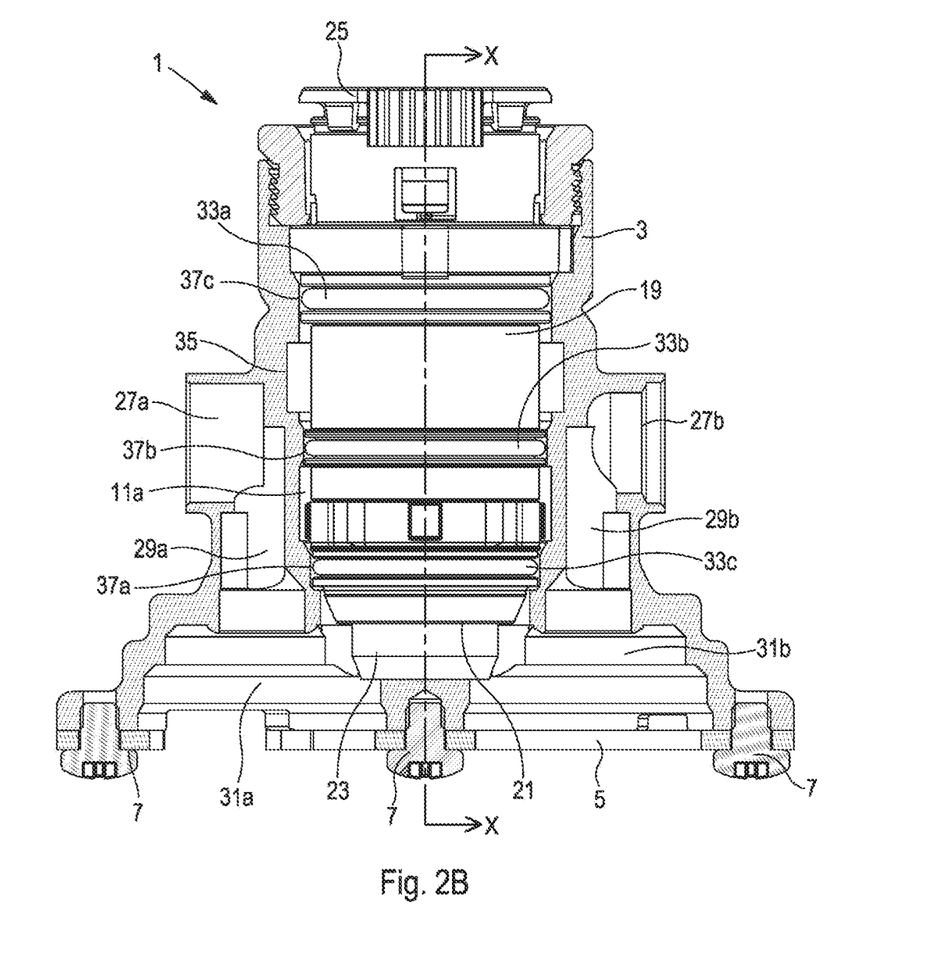
FIG. 2B illustrates a sectional view of an example fitting taken through the outlets of the body, perpendicular to the view in FIG. 2A.

FIG. 1 illustrates an example of a mixer shower fitting 1, which is used as an example to illustrate various embodiments. FIGS. 2A and 2B illustrate the fitting 1 in sectional view. The two views of FIGS. 2A and 2B are taken at 90 degrees to each other.

The shower fitting 1 has a substantially cylindrical body 3 formed by a cylindrical housing defining a longitudinal axis X-X. The body/hosing 3 is secured to a mounting plate 5, which in turn is fitted to a wall or other support surface (not shown). Thus, in use, the axis X-X projects out of the wall or support surface.

In the below, reference will be made to the top/front and bottom/rear of the fitting 1 and various components of the fitting 1. These terms are defined along the axis X-X, with respect to the plate 5. Therefore, the "bottom", "base" or "rear" of an element is the end closest to the plate 5, whilst the "top" or "front" is the opposing end, spaced from the plate 5. The upwards/downwards and forwards/backwards directions will also be defined along this axis X-X with upwards/forwards being along the axis X-X away from the plate 5 and down/backwards being along the axis X-X towards the plate 5.

In one example, the body 3 is secured to the mounting plate 5 by screws 7, however it will be appreciated that this is by way of example only, and various mechanisms for securing the body 3 to the plate 5 will be understood by the person skilled in the art. For example, any suitable mechanical fixing may be used, or interengaging projections may be used.

As shown in FIG. 2A, the body 3 and plate 5 define a pair of inlets 9a,b for connecting to water supply pipes (not shown). In this example, a first inlet 9a is arranged to connect to a hot water supply, and the second inlet 9b, is connected to a cold water supply.

Each of the body inlets 9a,b is coupled to a respective inlet passage 13a,b defined in the housing, which in turn has an opening 15a,b into an inner chamber 11 defined in the housing. The inlet passages 13a,b extend along the axis X-X, and are formed in projections extending radially out from the body 3. The two inlet passages 13a,b are formed at diametrically opposed positions around the body 3.

The chamber openings 15a,b are controlled by check valves 17a,b, which are biased to close the chamber openings 15a,b. Under sufficient water pressure, the check valves 17a,b open, to permit passage of water into the chamber 11. In one example, the check valves 17a,b may open with a pressure of 0.025 bar or more.

A thermostatic mixer cartridge 19 is received in the chamber 11 to mix the hot and cold water. In FIG. 2A, the cartridge 19 is shown in cut-through view, whilst in FIG. 2B, the outer surface of the cartridge 19 is shown. The cartridge 19 has hot and cold inlets (not shown) axially aligned with the chamber openings 15a,b to receive water from the body inlets 9a,b.

The thermostatic mixer cartridge 19 is substantially cylindrical in shape and extends along the axis X-X and has a single outlet 21 for mixed water at its base. The body 3 defines an outlet chamber 23 into which the outlet 21 opens. A control 25 is provided to control the mixing of the water, to vary the temperature at the outlet 21.

The check valves 17a,b, thermostatic mixer cartridges 19 and controls 25 are known in the art.

As best shown in FIG. 2B, a number of seals 33a-c are formed around the outer surface of the cartridge 19, spaced along the length of the cartridge 19. The seals 33a-c engage respective portions 37a-c of the inner surface 35 of the housing 3, defining the inner chamber 11.

The surface portions 37a-c and seals 33a-c are annular, extending around the full circumference of the chamber 11 and cartridge 19, and thus divide the inner chamber 11 into two sub-chambers 11a,b. A first sub-chamber 11a is axially aligned with the first chamber opening 15a, from the first inlet passage 13a and the hot water inlet of the cartridge 19.

A second sub-chamber 11b is axially aligned with the chamber opening 15b, from the second inlet passage 13b and the cold water inlet of the cartridge 19.

The second sub-chamber 11b is axially forward of the first sub-chamber 11a, therefore, as best shown in FIG. 2A, the second inlet passage 13b extends axially further forward than the first inlet passage 13a.

As best shown in FIG. 2B, the body 3 defines a pair of outlet openings 27b. Each outlet opening 27a,b provides mixed water from the mixer cartridge 19, and may be connected to a different output device (not shown). For example, a first outlet 27*a* may connect to an overhead showerhead, and a second outlet 27*b* may connect to a handheld unit.

Each outlet opening 27*a,b* is connected to the outlet chamber 23 by a respective outlet passage 29*a,b* defined in the housing 3. The outlet passages 29*a,b* extend parallel to the axis X-X, with water flowing in a direction away from the base 5. Thus, the outlet openings 27*a,b* are arranged on the side of the body 3.

Within each outlet passage 29*a,b*, a valve chamber 31*a,b* is formed. The valve chambers 31*a,b* receive a respective valve module (not shown), to control the flow to the outlets 27*a,b*.

The outlet passages 29*a,b* are formed at diametrically opposed positions around the body 3. Like the inlet passages 13*a,b*. the outlet passages 29*a,b* are formed in projections extending radially out from the body 3. However, unlike the inlet passages 13*a,b*, the outlet passages 29*a,b* extend the same length along the axial direction X-X.

The outlet passage 29*a,b* are spaced from the inlets passages 13*a,b* by 90 degrees around the axis X-X, thus the four passages 13*a,b*,29*a,b* are equally spaced around the body 3 of the fitting 1.

Within the fitting 1, a temperature differential exists between the hot water at the first inlet 9*a* and the cold water at the second inlet 9*b*. The fitting 1 includes an apparatus 39 to generate electrical power using this differential.

In the example shown, the apparatus 39 includes a pair of thermoelectric devices 41, provided on the exterior surface of the body 3. A first thermoelectric device 41 is provided between the first outlet passage 29*a* and the first inlet passage 13*a*, and a second thermoelectric device 41 is provided between the first inlet passage 13*a* and the second outlet passage 29*b*.

Figure 3:
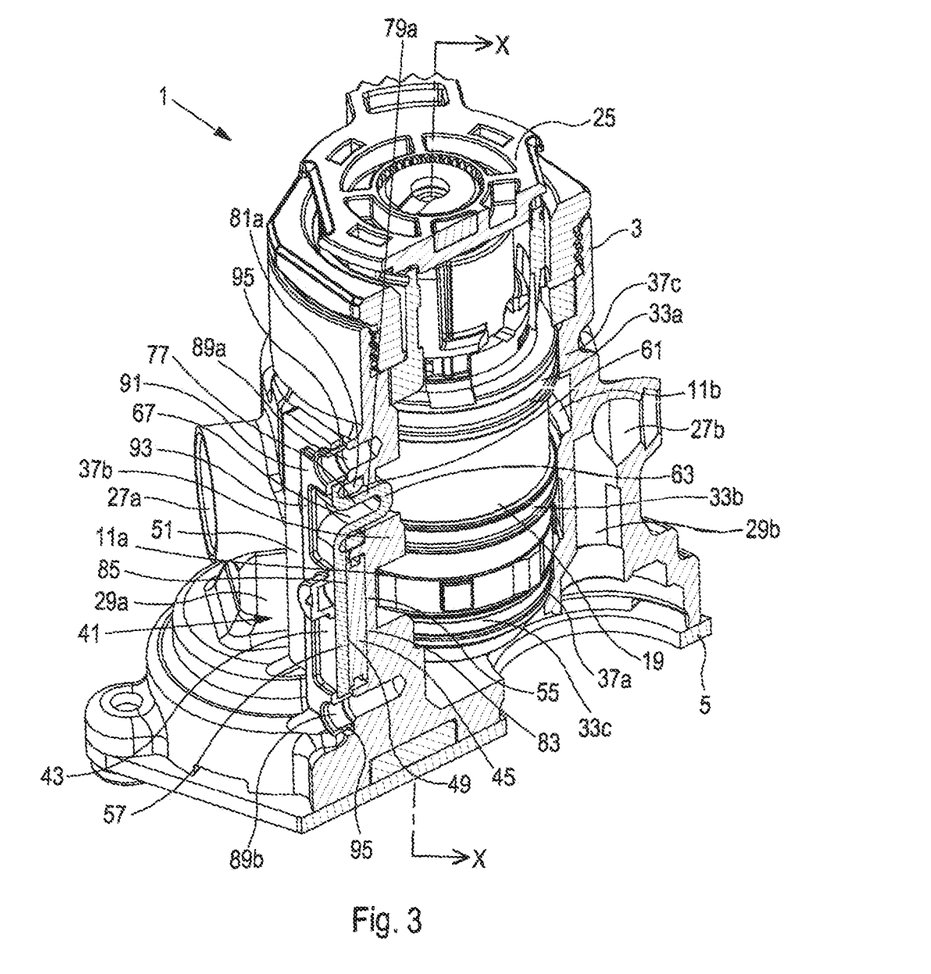
FIG. 3 illustrates an example fitting, with the housing cut away.

FIG. 3 shows the fitting 1, with the housing 3 cut-away to show a sectional view of the first thermoelectric device 41. it will be appreciated that the construction of the first thermoelectric device 41 is the same as the second 41.

The thermoelectric device 41 includes a respective heat transfer plate 43 and a thermoelectric module 45 provided between the heat transfer plate 43 and the housing 3.

Figure 4:
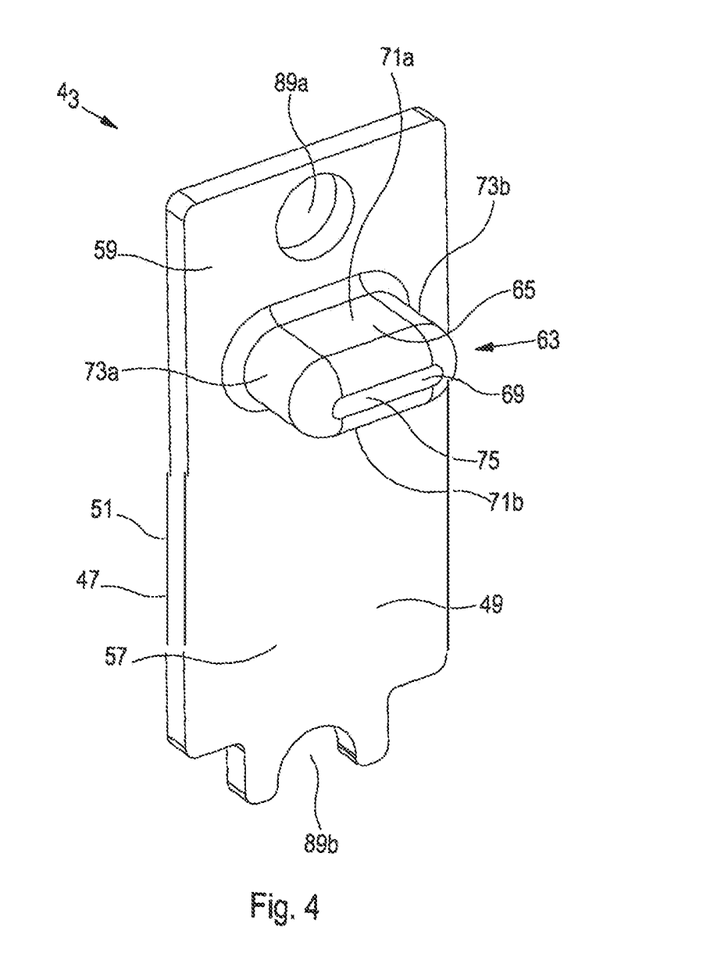
FIG. 4 illustrates an example heat transfer plate.

FIG. 4 shows an example of a heat transfer plate 43 in more detail. The plate 43 is substantially rectangular in shape, with a planar body 47, and is formed of a thermally conductive material The body 3 includes a wedge shaped projection 53 on its exterior surface, to provide a flat surface on which to mount the plate 43. The projection 53 includes a recess or indent 55, shaped to receive the thermoelectric module 45. The recess 55 is axially aligned with the first sub-chamber 11*a* of the inner chamber 11 of the housing, where the hot water passes into the thermostatic cartridge 19. The recess is circumferentially positioned between the projection forming the first inlet passage 13*a* and one of the outlet passages 29*a,b*.

The body 3 is also formed of a thermally conductive material, such that a first side 83 of the thermoelectric module 45 is coupled to the body, which is turn is heated by the water in the first sub-chamber 11*a* and/or the inlet passage 13*a*.

In the position of the recess 55, the housing 3 may be of reduced thickness to improve the thermal conduction of the hot water to the thermoelectric module 45.

The heat transfer plate 43 has a first side 49 which, in the assembled fitting 2, abuts the housing 3 and thermoelectric module 45, and an opposing, outward facing, second side 51.

The heat transfer plate 43 has a first portion 57, which, in the assembled fitting 1, overlies the recess 55. Thus the thermoelectric module 45 is fitted between the first portion 57 of the heat transfer plate 43, and the housing 3 in the region of the first sub-chamber 11*a* of the fitting 1.

The heat transfer plate 43 has a second portion 59 extending axially forward from the first portion 57, past the projection 37*b* dividing the first sub-chamber 11*a* from the second sub-chamber 11*b*, and into a region of the housing 3 overlapping the second sub-chamber 11*b*.

At the region where the heat transfer plate 43 overlaps the second sub-chamber 11*b*, an aperture 61 extending through the housing 3 into the second sub-chamber 11*b* is formed. The heat transfer plate 43 includes a corresponding projection 63 that extends from the first side 49 of the plate 43, through the aperture 61, into the second sub-chamber 11*b*.

In the example shown, the projection 63 is substantially rectangular in shape. It has a sidewall 65 extending around the outside of the projection defining a hollow void 67 within. The void 67 is closed by an end wall 69 at the radially inner end, and open to the outer surface 51 of the heat exchange plate 43 at the radially outer end.

The sidewall 65 and end wall 69 defines a first pair of parallel spaced surface 71*a,b*, a second pair of the parallel spaced surface 73*a,b* extending perpendicular to the first pair 71*a,b*, and connecting the ends of the first pair 71*a,b*, and an end surface 75. These inner (wet) surfaces 71*a,b*, 73*a,b*,75 extend into the second sub-chamber 11*b*, and directly contact the cold water in the second sub-chamber 11*b*. Opposing these surfaces is a radially outer (dry) surface 77.

Around the edge of the aperture 61 in the housing 3, a step 79 is formed. This step 79 forms a seat for locating a seal 81 that seals between the housing 3 and the heat transfer plate 43, preventing leakage from the second sub-chamber 11*b* though the aperture 61.

As discussed above, the heat transfer plate 43 is formed of a thermally conductive material. Therefore, the cold water in the second sub-chamber 11*b* is thermally coupled to the second side 85 of the thermoelectric module 45, opposite the first side 83.

In this way, the thermoelectric module 45 is provided at a first region of the fitting 1. The first side 83 of the thermoelectric module 45 is thermally coupled to the hot water in that first region (first sub-chamber 11*a* and/or inlet passage 13*a*) of the fitting 1, through the body 3. The second side 85 of the thermoelectric module 45 is thermally coupled to the cold water in a separate, different region, by use of a heat transfer plate 43 to transfer heat to the first region.

The heat transfer plate 43 is secured to the body by screws (not shown) extending through screw holes 89 in the plate 43, into the housing 3. The heat transfer plate 43 has a first screw hole 89*a* formed through it axially forward of the projection 65. A second screw hole 89*b* is formed at the opposite end of the heat transfer plate 43 (in the axial direction). The second screw hole 89*b* may be partially open, forming a hoop, as shown in FIG. 4.

A thermal washer plate 91 is also provided. The washer plate 91 is formed of a non-thermally conductive material. The plate has a planar body 93 that has end portions 93*a* which sit between the heads of the screws (not shown) and the heat transfer plate 43, and a connecting portion 93*b* extending between the end portions 93*a*.

The thermal washer plate 91 provides a surface for the screws (not shown) to bear against. Furthermore, the thermal washer plate 91 has annular projections 95 extending into the screw holes 89*a,b* such that the projections 95 sit between the screws (not shown) and the heat transfer plate 43. The thermal washer plate 91 ensures that the screws (not shown), which are thermally coupled to the housing 3, are thermally isolated from the heat transfer plate 43, to prevent heat loss through the screws.

The thermal washer plate 91 also includes a cylindrical projection 133 projecting outward from the body 93, in the opposite direction to the projections 95. The projection ensures that the washer plate 91 can only be installed in the correct orientation.

Figure 5:
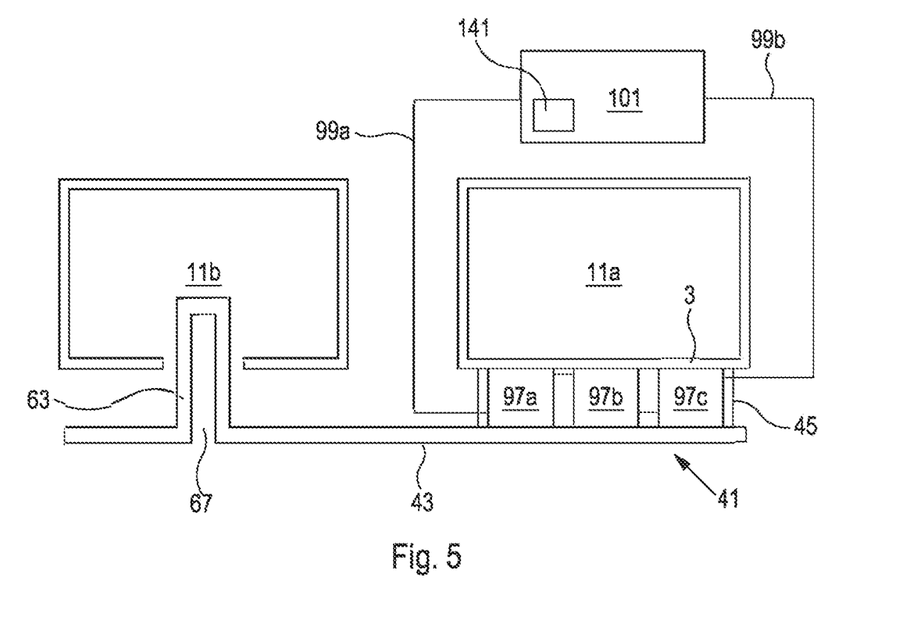
FIG. 5 schematically illustrates an example circuit.

FIG. 5 schematically illustrates the circuit formed at one of the thermoelectric devices 41 in more detail. The thermoelectric modules 45 comprise a plurality of thermoelectric elements 97a-c (three are shown for illustrative purposes, but there could be any number). The thermoelectric elements 97a-c are arranged thermally in parallel between the heat transfer plate 43 and the housing 3, and are connected electrically in series. The thermoelectric elements 97a-c may comprise, or consist essentially of, any suitable thermoelectric material(s) such as bismuth telluride.

Each thermoelectric module 45 is connected to a pair of electrical wires 99a,b. Each pair of electrical wires 99a,b is arranged to carry electric current to and from one of the thermoelectric modules 45.

Where multiple thermoelectric modules 45 are provided, the separate modules may similarly be connected so that the separate elements of each module remain electrically in series, and thermally in parallel.

The electrical wires 99a,b may connect the thermoelectric module(s) 45 to any electrical component(s) or device(s) 101. For instance, electricity generated in the thermoelectric module(s) 45 may be used to power one or more lights, e.g. LED lights. The light(s) may be decorative or ornamental. The light(s) may for example be operable to provide supplemental and/or entertaining illumination in a room such as a bathroom, wetroom or washroom, e.g. within a shower enclosure or shower cubicle. The light(s) may be indicative of the operating state of an ablutionary fitting or plumbing fixture such as a shower unit, a showerhead, a sprayer, a mixer valve, (e.g. a thermostatic mixer valve), a tap, a faucet, a toilet, a flush for a toilet or a bidet.

The thermoelectric module(s) 45 may be electrically connected to an electricity storage device (not shown) such as a battery or a capacitor for later use according to user demand.

By powering the electrical component(s) or device(s) 101 using electricity generated from a temperature differential, there may be no need to connect the electrical component(s) or device(s) to the mains or another electricity supply. For example, this may alleviate to some extent potential problems in connecting the electrical component(s) or device(s) to the mains or another electricity supply when the electrical component(s) or device(s) is/are located in a wet environment such as a shower enclosure, a shower cubicle, a bathroom, a washroom or a wetroom.

As best shown in FIGS. 1 and 2A, the apparatus 39 includes an electrical socket 103. The electrical socket 103 is provided to enable easy connection between the thermoelectric devices 41 and the output device 101.

In the example shown, the socket 103 is provided on a support member 105 extending from the backing plate 5. The support member 105 is substantially planar in shape, extending perpendicular to the axial direction X-X. The socket 103 is formed on the support member 105, such that it is spaced from the housing 3 for easy access and connection.

The socket 103 is formed by a projection 107 formed on the support member 105. The projection 107 comprises a cylindrical side wall 109 extending around an opening in the support member 105, and in a direction axially forward from the support member 105. On top of the side wall 109 (i.e. axially forward), a body member 111 is formed. The body 111 has a front portion 111a extending axially forward from the sidewall 109, and a rear portion 111b extending into the space 113 defined within the sidewall 109. The rear portion 111b only extends a portion of the length of the sidewall 109, such that a recess 115 is formed in the rear surface of the support member 105.

The front portion 111a of the body member 111 has an outer wall 117 that extends radially outside the sidewall 109, and tapers inwards as it extends forwards along the axial direction. The outer wall 117 extends rearward, past the end of the sidewall 111, thus forming an outer lip 117a on its rear end.

A pair of pogo pin connectors 119 are provided. The pogo pin connectors 119 extend through the body member 111 forward of the projection 107, and rearward into the recess 115.

In use, the wires 99a,b extend from the thermoelectric modules 45, and connect to the pogo connector pins 119 on the rearward side of the support member 105. In one example, openings (not shown) may be provided in the support member 105 for the wires 99a,b to pass through. In other examples, the wires 99a,b may simply pass round the edge of the support member 105.

Operation of the apparatus 39 will now be described. There is a temperature difference between the cold water flowing in the second sub-chamber 11b and the hot water flowing in the first sub-chamber 11a and/or hot water inlet passage 13a.

In the UK, a hot water supply may typically have a temperature of around 65° C. and a cold water supply may typically have a temperature of around 15° C. The exact temperatures of the hot water supply and/or the cold water supply may vary with location, e.g. country, season, time of day and/or weather conditions.

At the location of the thermoelectric device(s) 41, the temperature difference between the cold water flowing in the first pipe 3 and the hot water flowing in the second pipe 4 will depend for example on the proximity of the apparatus 1 to the hot water supply and/or the cold water supply.

The temperature difference between the cold water flowing in the second sub-chamber 11b and the hot water flowing in the first sub-chamber 11a and/or hot water inlet passage 13a may be up to or at least 10° C., up to or at least 20° C., up to or at least 30° C., up to or at least 40° C. or up to or at least 50° C.

The heat plate 43 enables the position of the temperature differential to be moved by conducting the temperature of the cold water to a different location. Heat is also conducted from the first sub-chamber 11a and/or hot water inlet passage 13a through the housing 3 of the fitting 1. As a consequence of the temperature difference between the water flowing in the second sub-chamber 11b and water flowing in the first sub-chamber 11a and/or hot water inlet passage 13a, a temperature difference exists between the first portion 57 of the heat transfer plate 43 and the housing 3 of the fitting 1.

In the illustrated example embodiment, the temperature difference between the first portion 57 of the heat transfer plate 43 and the housing 3 of the fitting extends radially outward from the axial direction X-X. On the other hand, the temperature difference between the first sub-chamber 11a and/or the hot water inlet passage and the second sub-chamber 11*b* is parallel to the axial direction X-X.

The thermoelectric module 45 is disposed between the first portion 57 of the heat transfer plate 43 and the housing 3 of the fitting 1 in the region of the first sub-chamber 11*a*. The thermoelectric module 45 is configured to generate electricity as a result of the temperature difference between the first portion 57 of the heat transfer plate 43 and the housing 3. The generated electricity is transported by the electrical wires 99*a,b* to any electrical component(s) or device(s).

It will be appreciated that although the embodiment discussed above has a pair of thermoelectric devices 41, each with a single thermoelectric module 45, any number of separate devices 41 may be provided, each device having any number of modules 45.

Figure 6:
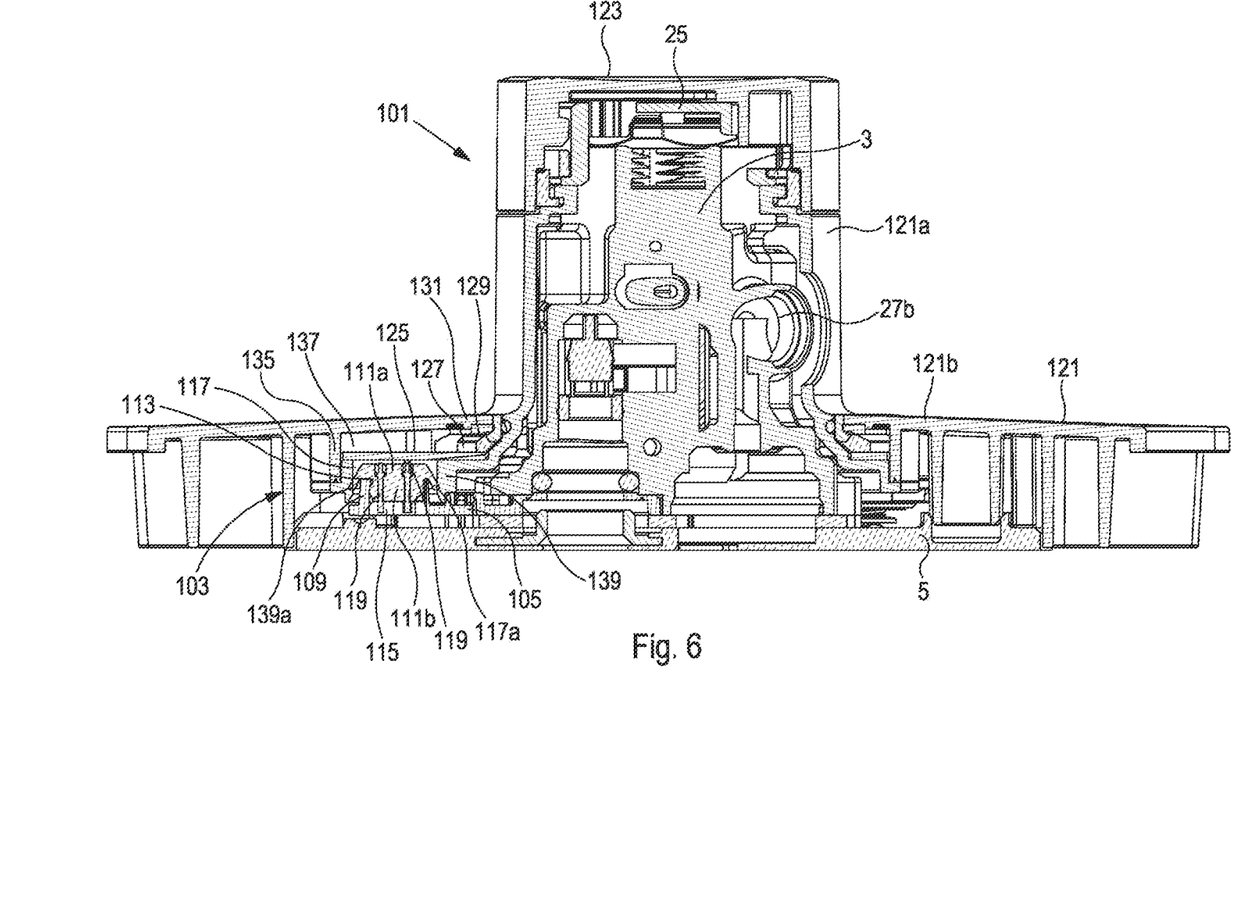
FIG. 6 schematically illustrates an example fitting including an output device.

FIG. 6 illustrates one illustrate example of how an output device 101 may be incorporated into the fitting.

As shown in FIG. 6, the ablutionary fitting 1 may have a cover plate 121 arranged to fit over the housing 3. The cover plate has a cylindrical section 121*a* arranged to cover the housing 5, and a planar section 121*b* extending radially outward from the cylindrical section 121*a*.

The cover plate 121 may be secured to the backing plate 3 by any suitable means, such as interengaging projections or screws. The cover plate 121 may define a user control device 123 to operate the control 25 of the thermostatic cartridge and may also include other user control devices (not shown), such as push buttons, for operating valves to open and close the outlets 27*a,b*.

Within the cover plate 121, the output device 101 is also formed. In this case, the output device 101 comprises a printed circuit board (PCB) 125. One or more LEDs 127 are mounted on the PCB, with a cover lens 129 provided over the LEDs. The PCB 125 contacts the pogo pins 119 of the socket 103. Electrical tracks (not shown) formed in the PCB 125 provide an electrical connection between the pogo pins 119 and the LEDs 127.

In the example shown, the LEDs are provided in the planar portion 121*b* of the cover 121, adjacent the join between the planar portion 121*b* and the cylindrical portion 121*a*. The LEDs 127 may extend around the full circumference of the cylindrical portion 121*a*, or only a portion. Alternatively, the LEDs 127 may be provided in other positions, anywhere on or near the fitting 1. The cover 121 includes a transparent portion 131 overlying the LEDs 127.

The cover 121 also includes internal formations 135 to form an enclosed chamber 137 around the PCB 125. The enclosed chamber 137 has an opening 139 aligned with the socket 103. The socket projection 107 extends into the opening 139. The opening has projection 139*a* arranged to engage the lip 117*a* on the projection 107, to hold the socket in place. A grommet is formed by the outer wall 117 to provide a water tight seal between the socket 103 and the cover 121, to ensure no water can pass form the exterior of the fitting 1, into the area around the PCB 125 and LEDs 127.

The LEDs 127 are powered by a current generated by the thermoelectric modules 45*a,b*. In one example, the current may pass directly to the LEDs 127. Thus the output is dependent on the current provided, which is, in turn dependent on the established temperature difference (i.e. the output is brighter as the temperature difference increases).

In other examples, a controller 141 may be provided on the PCB, arranged to control the output of the LEDs. In one example, the controller 141 may monitor the voltage or current generated and control the output based on this. In further examples, the LEDs may be controlled based on a switch (not shown) provided on the fitting 1, or a thermistor at the inlets 9 or outlets 27.

For example, the controller 141 may monitor the stability and/or magnitude of the current or voltage generate.

In one example, when a user desires warm water from the fitting 1, they may turn on the fitting 1 and set a desired temperature. To start with, water provided at the hot inlet 9*a* is cold, due to latency in the system. In this case, the thermostatic cartridge 19, initially only draws water from the hot inlet 9*a*.

As the water from the hot inlet 9*a* gradually increases in temperature, the cartridge 19 starts to draw both hot and cold water, until the desired temperature is reached at the outlet 21. Furthermore, as the water at the hot inlet 9*a* gradually increases in temperature, the current/voltage output form the thermoelectric module(s) 45 also increases.

In one example, using the above operation, the controller 141 may control the LEDs to have three different output modes:

Mode 1: Stable current/voltage below a first threshold (indicative of a low temperature difference, when the fitting 1 is not in use);

Mode 2: Increasing/unstable voltage/current (indicative of an increasing temperature difference, as the water through the hot inlet 9*a* gradually increases in temperature);

Mode 3: Stable voltage/current above a second threshold, optionally the same as the first (indicative that the water at the hot inlet 9*a* is at a constant temperature).

Therefore, the LEDs 127 may be used as an indicator of when the water from the hot inlet 9*a* is at the correct temperature.

The different modes may include any one or more of: no output (i.e. LEDs off), flashing, varying intensity, varying number of LEDs off, different colour LEDs on/off and the like.

In one example, Modes 1 and 3 may be the same operational mode, with the output proportional to the magnitude of the generated voltage/current.

In use, the thermoelectric module 45 may continue to generate electricity after a user has finished using the ablutionary fitting 1, since there will still be water in the first and second sub-chambers 11*a,b* and the hot water inlet passage 13*a*, and there will be a temperature across the thermoelectric module 45. In embodiments, the thermoelectric device may continue to generate electricity for a period of up to or at least 5 minutes, up to or at least 10 minutes or up to or at least 15 minutes after the used has finished using the ablutionary fitting.

In the example discussed above, the generated electricity is used to power LEDs 127. In alternative examples, a portion of the generated electricity may be stored, e.g. in a capacitor or battery, for subsequent use. This may permit for example one or more electrical components and/or devices to operate during start-up of the ablutionary fitting 1 after a period of inactivity, when the no temperature difference exists across the thermoelectric module 45. As the water in the hot water inlet passage 13*a* heats up, the thermoelectric module 45 will then generate electricity from the consequent temperature difference.

As discussed above, the heat transfer plate 43 and body 3 are formed of thermally conductive materials. The housing 3 and heat transfer plate 43 may be formed of the same material, or different materials. One example of a suitable thermally conductive material is a metal or an alloy, which may comprise, or consist essentially of, copper, aluminium or brass. Alternatively, the heat transfer plate 43 and housing 3 may comprise, or consist essentially of, a thermally conductive plastic, or a plastic such as an engineering plastic with a thermally conductive material therein and/or thereon. For instance, the thermally conductive material may coat at least partially the plastic. The thermally conductive material may extend through the plastic, e.g. engineering plastic.

The heat transfer plate 43 and/or housing 3 may be arranged to maximise the temperature differential across the thermoelectric module 45, in order to increase the efficiency of generation of electricity.

For example the projection 63 may include fins, or additional surfaces to increase the overall surface area of the heat transfer plate 43 in contact with the cold water in the sub-chamber 11b. The surface area in contact with cold water may vary between 100 and 2000 mm².

Similarly, the thickness of the housing forming the body 3 may optionally be reduced in the region of the thermoelectric module 45. For example, the housing may typically be between 0.5 and 5 mm thick in the region of the module, 45, and may be between 20 and 200 mm away from the module 45.

The heat transfer plate 43 may be between 20 and 200 mm in length and 20 and 200 mm in width. The thickness of the heat transfer plate 43 may be between 0.5 and 5 mm. On the surface of the heat transfer plate 43, the projection 63 may have length between 2 and 100 mm and a width between 2 and 100 mm. Along the axial direction, the distance between the projection 63 and the thermoelectric module 45 may be between 2 and 150 mm (measured from the closest edges i.e. the rear edge of the projection 63 to the forward edge of the module 45.

In the example discussed above, the heat transfer plate 43 and thermoelectric module 45 are planar, and the curved housing 3 includes a wedge projection 53 to provide a flat surface to engage both. It will be appreciated that in other examples the heat transfer plate and/or module may either be curved, or have at least a curved surface for engaging the housing 3. Alternatively, the housing 3 may have planar surfaces.

The housing 3 may be formed of a single unitary part, or may be may of any number of parts joined together. Although in the example discussed above, the housing has a chamber 11 split into two sub-chamber 11a,b by seals 33a-c on the cartridge 19, it may be that the chambers 11a,b are formed separately. Likewise, any suitable number of chambers may be formed. For example, there may only be a single chamber for cold water, and the hot water may be provided directly to the cartridge. In this case, the heat is transferred from the hot water inlet passage 13a. Alternatively, three or more chambers may be formed, with two or more chambers optionally carrying water at the same temperature.

In the example shown above, each of the sub-chambers 11a,b extends around the full circumference of the body 3, however, this need necessarily be the case. In other examples, the sub-chambers may only extend around a portion of the circumference of the body 3.

In the example discussed above, a pair of thermoelectric modules 45 are provided in the spaces either side of the hot water inlet passage 13a. It will be appreciated that instead of or as well as this, a thermoelectric module 45 may be provided directly over the hot inlet passage 13a.

In the example discussed above, a single washer plate 91 is provided to thermally isolate the heat transfer plate 43 from the housing 3, by thermal conduction through the screws (not shown). It will be appreciated that this function may be provided by separate thermal washers at each screw (not shown).

One example of a socket 103 is discussed above. However, it will be appreciated that this is by way of example only. It will be appreciated that any suitable connection may be formed to connect the thermoelectric module(s) 45 to the output devices 101. In some examples, the socket 103 may be omitted altogether, and the thermoelectric modules 45 may be directly connected to the output device(s) 101.

In the example discussed above, a pair of thermoelectric devices 41a,b are coupled to the same socket and output device 101. It will be appreciated that with multiple thermoelectric device 41, this need not be the case, each thermoelectric device 41 may have a separate socket and/or output device 101, or two or more thermoelectric devices 41 may be connected to the same socket and/or output device 101.

In the example discussed above, heat transfer plate 43 is in direct contact with the cold water and the thermoelectric module is thermally coupled to the hot water through the housing 3. However, it will be appreciated that this may be swapped, such that heat transfer plate is in direct contact with the hot water. This may either by swapping which sub-chamber 11a,b receives hot and cold water, or by having the thermoelectric module 45 in the region of the cold water chamber 11b, and the projection 63 extending into the hot water chamber 11a.

In yet further examples, the housing 3 may include sealed openings into both chambers such that the water in the first chamber 11a is thermally coupled to the thermoelectric module 45, with directly or via a second heat transfer plate in direct contact with the hot water.

The heat transfer plate may at least in part form a seat for locating the seal.

The thermoelectric module may be in direct contact with the housing of the ablutionary fitting.

The socket may be mounted on a support member, and may be electrically coupled to the thermoelectric elements by wires.

The output load may include one or more light emitting devices.

The apparatus may be installed in an ablutionary fitting that includes a mixer cartridge.

At least a portion of the sub-chamber may overlap the second region in a circumferential direction, and the first region and second region may be spaced along the axial direction.

The projection may extend along a first direction, and the second portion may extend in a direction substantially perpendicular to the first direction.

First and second apparatuses may be_circumferentially spaced around the housing, on opposite sides of the inlet passage In the examples discussed above, the temperature difference between the cold water and hot water at the inlets is used to generate electricity. In other examples, the temperature difference between the cold water at the inlet and the mixed water at the outlet may also be used. It will be appreciated that this temperature differential is dependent on user settings for the desired output temperature of the fitting. Therefore, for lower output temperature, the temperature difference will be reduced, and so the electricity generated will be reduced.

While a specific embodiment has been described, various modifications will be apparent to the person skilled in the art without departing from the scope of the present disclosure.

It will be understood that the invention is not limited to the embodiments above-described and various modifications and improvements can be made without departing from the concepts herein. Except where mutually exclusive, any of the features may be employed separately or in combination with any other features and the disclosure extends to and includes all combinations and sub-combinations of one or more features described herein.

The invention claimed is:

1. An apparatus comprising:
   one or more heat transfer plate, each one or more heat transfer plate having a projection portion and a remaining portion, wherein the projection portion comprises only one projection configured to directly contact water carried in a first region of an ablutionary fitting, wherein the projection comprises a plurality of surfaces extending into a chamber formed in the first region of the ablutionary fitting, and wherein the remaining portion is external to the first region; and
   a thermoelectric module comprising one or more thermoelectric elements, the one or more thermoelectric elements being thermally coupled between each one or more heat transfer plate and a housing of the ablutionary fitting in a second region of the ablutionary fitting, the one or more thermoelectric elements also being configured to generate electricity from a temperature differential between water carried in the first and second regions of the ablutionary fitting.

2. An apparatus as claimed in claim 1, wherein each one or more heat transfer plate comprises a first portion including the projection, and a second portion extending away from the first portion, the second portion being thermally coupled to the one or more thermoelectric elements, the first portion also being thermally coupled to the second portion.

3. An apparatus as claimed in claim 2, wherein each one or more heat transfer plate is substantially planar, and the projection extends out of a plane of each one or more heat transfer plate.

4. An apparatus as claimed in claim 1, comprising a seal to form a water-tight seal between the first portion of each one or more heat transfer plate and the housing of the ablutionary fitting, around the projection.

5. An apparatus as claimed in claim 1, comprising an electrical socket electrically coupled to the one or more thermoelectric elements and configured to be connected to an output load.

6. An apparatus as claimed in claim 5, comprising:
   a controller controlling the output from the socket and/or the operation of the output load, based on a voltage generated by the thermoelectric module.

7. An apparatus as claimed in claim 6, wherein the controller controls electrical output from the socket and/or the output load, based on the voltage generated by the thermoelectric module.

8. An apparatus as claimed in claim 7, wherein the controller controls the output from the socket and/or the operation of the output load in two modes comprising: a first mode when the output is a first voltage value, and a second mode when the output is a second voltage value.

9. An apparatus as claimed in claim 8, wherein output in the first mode is dependent on a magnitude of the voltage.

10. An apparatus as claimed in claim 1, wherein each one or more heat transfer plate has a first side and a second side and wherein the projection extends from the first side of each one or more heat transfer plate and the first side of each one or more heat transfer plate abuts the thermoelectric module.

11. An ablutionary fitting comprising:
    a housing defining: a first inlet for receiving water at a first temperature, a second inlet for receiving water at a second temperature, different to the first temperature, and an internal chamber receiving a cartridge for mixing the water from the first inlet and second inlet; and
    an apparatus mounted on an exterior surface of the housing, the apparatus comprising:
      one or more heat transfer plate, each one or more heat transfer plate having a projection portion and a remaining portion, wherein the projection portion comprises only one projection configured to directly contact water carried in a first region of the ablutionary fitting from the first inlet, wherein the projection comprises a plurality of surfaces extending into a chamber formed in the first region of the ablutionary fitting, and wherein the remaining portion is external to the first region; and
      a thermoelectric module comprising one or more thermoelectric elements, the one or more thermoelectric elements being thermally coupled between each one or more heat transfer plate and the housing of the ablutionary fitting in a second region of the ablutionary fitting carried from the second inlet, the one or more thermoelectric elements also being configured to generate electricity from a temperature differential between water carried in the first and second regions of the ablutionary fitting.

12. An ablutionary fitting as claimed in claim 11, wherein the housing comprises an aperture extending through the housing into the internal chamber in the first region of the ablutionary fitting.

13. An ablutionary fitting as claimed in claim 12, wherein the apparatus comprises a seal to form a water-tight seal between the first portion of each one or more heat transfer plate and the housing of the ablutionary fitting, around the projection, wherein the housing at least in part defines a seat for locating the seal.

14. An ablutionary fitting as claimed in claim 11, comprising an indent in the housing arranged to receive the thermoelectric module, the indent forming the second region.

15. An ablutionary fitting as claimed in claim 11, wherein the internal chamber and housing are substantially cylindrical, extending in an axial direction.

16. An ablutionary fitting as claimed in claim 15, the thermoelectric module and each one or more heat transfer plate being mounted on a planar surface formed by a wedge-shaped projection.

17. An ablutionary fitting as claimed in claim 15, wherein the housing defines a sub-chamber formed within the internal chamber at a first axial position along a length of the cylinder, where water received at the first inlet enters the inner chamber to enter the cartridge, the sub-chamber forming the first region.

18. An ablutionary fitting as claimed in claim 17, wherein the housing defines:
    an inlet passage for directing water from the second inlet to a second sub-chamber formed within the internal chamber, where water from the second inlet enters the cartridge; and
    an outlet passage for directing water from the cartridge to an outlet device,
    wherein the inlet passage and outlet passage extend along the axial direction and are circumferentially spaced from each other, and
    wherein the second region is circumferentially between the inlet passage and the outlet passage.

19. An ablutionary fitting comprising:
a housing defining:
- a first inlet for receiving water at a first temperature,
- a second inlet for receiving water at a second temperature, different to the first temperature, and
- an internal chamber receiving a cartridge in which water from the first inlet and second inlet are mixed,
- where a first sub-chamber is formed within the internal chamber at a first axial position along a length of the internal chamber where water received at the first inlet enters the internal chamber to enter the cartridge, and a second sub-chamber is formed within the internal chamber at a second axial position along a length of the internal chamber where water received at the second inlet enters the internal chamber to enter the cartridge;

an apparatus mounted on an exterior surface of the housing, the apparatus comprising:
- one or more heat transfer plate, each one or more heat transfer plate having a projection portion and a remaining portion, wherein the projection portion comprises only one projection configured to directly contact water carried in one of the first sub-chamber or the second sub-chamber, wherein the projection comprises a plurality of surfaces extending into a chamber formed in one of the first sub-chamber or the second sub- chamber, and wherein the remaining portion is external to one of the first sub-chamber or the second sub-chamber; and
- a thermoelectric module comprising one or more thermoelectric elements, the one or more thermoelectric elements being thermally coupled between each one or more heat transfer plate and the housing of the ablutionary fitting in the second sub-chamber, the one or more thermoelectric elements also being configured to generate electricity from a temperature differential between water carried in the first and second sub-chambers of the ablutionary fitting.

* * * * *